United States Patent
Cheon et al.

(10) Patent No.: US 9,893,143 B2
(45) Date of Patent: Feb. 13, 2018

(54) ANALOG CAPACITOR

(71) Applicant: SK hynix Inc., Icheon-si, Gyeonggi-do (KR)

(72) Inventors: Jun Ho Cheon, Icheon-si (KR); Chang Yong Ahn, Icheon-si (KR); Seok Joon Kang, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/266,152

(22) Filed: Sep. 15, 2016

(65) Prior Publication Data

US 2017/0288012 A1 Oct. 5, 2017

(30) Foreign Application Priority Data

Apr. 4, 2016 (KR) .................. 10-2016-0041095

(51) Int. Cl.
| | |
|---|---|
| *H01L 27/01* | (2006.01) |
| *H01L 49/02* | (2006.01) |
| *H01L 23/522* | (2006.01) |
| *H01L 27/08* | (2006.01) |

(52) U.S. Cl.
CPC .......... *H01L 28/40* (2013.01); *H01L 23/5223* (2013.01); *H01L 27/0805* (2013.01); *H01L 28/55* (2013.01); *H01L 28/56* (2013.01); *H01L 28/75* (2013.01)

(58) Field of Classification Search
CPC ......... H01L 28/40; H01L 28/55; H01L 28/56; H01L 23/5223; H01L 27/0805
See application file for complete search history.

(56) References Cited

U.S. PATENT DOCUMENTS

| | | | | |
|---|---|---|---|---|
| 6,297,524 B1 * | 10/2001 | Vathulya | ............. | H01L 23/5223 257/296 |
| 2004/0201412 A1 * | 10/2004 | Miyake | ................ | G09G 3/3685 327/437 |
| 2014/0273394 A1 * | 9/2014 | Roehner | ................ | H01L 28/20 438/382 |

FOREIGN PATENT DOCUMENTS

KR 10-2011-0098913 A 9/2011

* cited by examiner

*Primary Examiner* — Fei Fei Yeung Lopez
(74) *Attorney, Agent, or Firm* — William Park & Associates Ltd.

(57) ABSTRACT

An analog capacitor is disclosed. The analog capacitor may include a main analog capacitor, an interlayer insulating layer, and a plurality of stacked sub analog capacitors. The main analog capacitor may be formed over a semiconductor substrate. The interlayer insulating layer may be interposed between the semiconductor substrate and the main analog capacitor. The plurality of stacked sub analog capacitors may be inserted into the interlayer insulating layer.

20 Claims, 8 Drawing Sheets

ANALOG CAPACITOR

CROSS-REFERENCES TO RELATED APPLICATION

This application claims priority under 35 U.S.C. 119(a) to Korean application No. 10-2016-0041095 filed on Apr. 4, 2016, in the Korean intellectual property Office, which is incorporated by reference in its entirety.

BACKGROUND

1. Technical Field

Various embodiments of the inventive concept generally relate to an analog capacitor of a semiconductor device, and more particularly to an analog capacitor of a semiconductor device capable of preventing output voltage variation due to parasitic capacitance.

2. Related Art

In general, analog capacitors may be formed in a peripheral circuit region of a semiconductor device together with logic circuits. In a complementary metal oxide semiconductor (CMOS) logic structure, the analog capacitors may have a metal-insulator-metal (MIM) structure.

The MIM analog capacitor may include a first metal layer, a dielectric layer, and a second metal layer. When these layers are formed, metal interconnect wires may be formed over the peripheral circuit region in which integrated circuits are located. This type of MIM analog capacitor, however, requires a separate process step to form the dielectric layer.

The analog capacitor may also be formed using a single metal layer.

The analog capacitor formed of the single metal layer may also be located over the peripheral circuit region in which peripheral circuits are formed, and this type of analog capacitor may be formed by placing a dielectric material between metals located on the same plane as the dielectric material.

However, since the analog capacitor formed of the single metal layer is located near the peripheral circuit region, the analog capacitor may be affected by noise. As a result, parasitic capacitances may induce noise in an output voltage of the analog capacitor.

SUMMARY

According to an embodiment, there is provided an analog capacitor. The analog capacitor may include a semiconductor substrate, a first level capacitor formed on the semiconductor substrate, a second level capacitor formed over the first level capacitor, and a third level capacitor formed over the second level capacitor. Each of the first to third level capacitors may include a first capacitor electrode and a second capacitor electrode insulated from each other to constitute a capacitor. The first capacitor electrodes of the first and second level capacitors may be floating, and the first capacitor electrode of the third level capacitor may be selectively coupled to an output voltage terminal.

According to an embodiment, there is provided an analog capacitor. The analog capacitor may include a semiconductor substrate, a first interlayer insulating layer, a first level capacitor, a second interlayer insulating layer, a second level capacitor, a third interlayer insulating layer, a third level capacitor, and a contact unit. The first interlayer insulating layer is formed in the semiconductor substrate. The first level capacitor may be formed over the first interlayer insulating layer, and ,ay include a first capacitor electrode and a second capacitor electrode. The second interlayer insulating layer may be formed over the first interlayer insulating layer in which the first level capacitor is formed. The second level capacitor may be formed over the second interlayer insulating layer, and may include a first capacitor electrode and a second capacitor electrode. The third interlayer insulating layer may be formed over the second interlayer insulating layer in which the second level capacitor is formed. The third level capacitor may be formed over the third interlayer insulating layer, and may include a first capacitor electrode and a second capacitor electrode. The contact unit may electrically couple the second capacitor electrodes of the first, second and third level capacitors to each other.

According to an embodiment, there is provided an analog capacitor. The analog capacitor may include a semiconductor substrate, a main analog capacitor, an interlayer insulating layer, and a plurality of stacked sub analog capacitors. The main analog capacitor may be formed over the semiconductor substrate. The interlayer insulating layer may be interposed between the semiconductor substrate and the main analog capacitor. The plurality of stacked sub analog capacitors may be inserted into the interlayer insulating layer.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
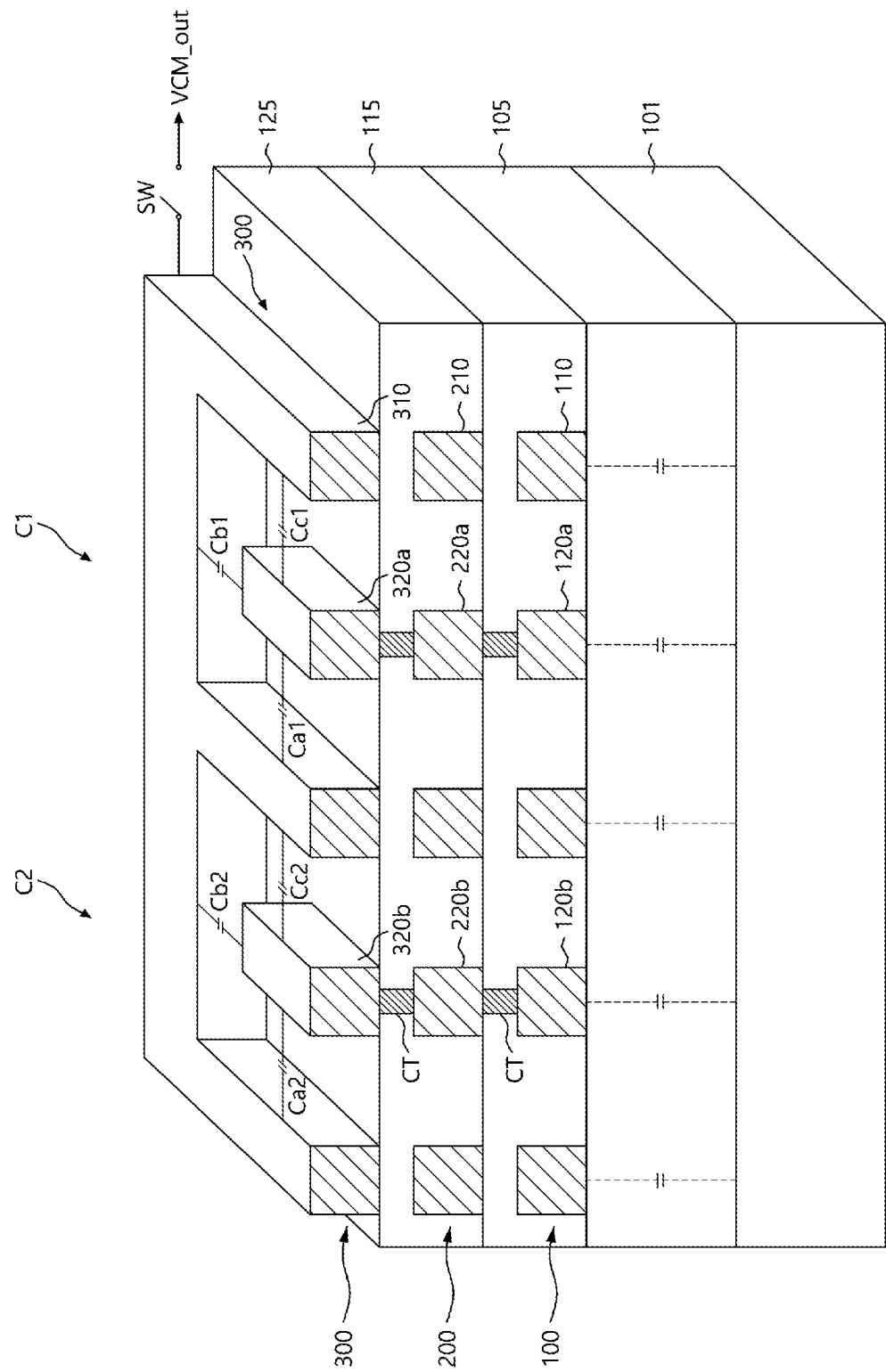
FIG. 1 is a perspective view illustrating an example of an analog capacitor according to an embodiment of the inventive concept.

Exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made in these exemplary embodiments without departing from the principles and spirit of the inventive concept.

Referring to FIG. 1, an analog capacitor according to an embodiment may include a first level capacitor 100, a second level capacitor 200, a third level capacitor 300, and first to third interlayer insulating layers 105, 115, and 125.

Figure 2:
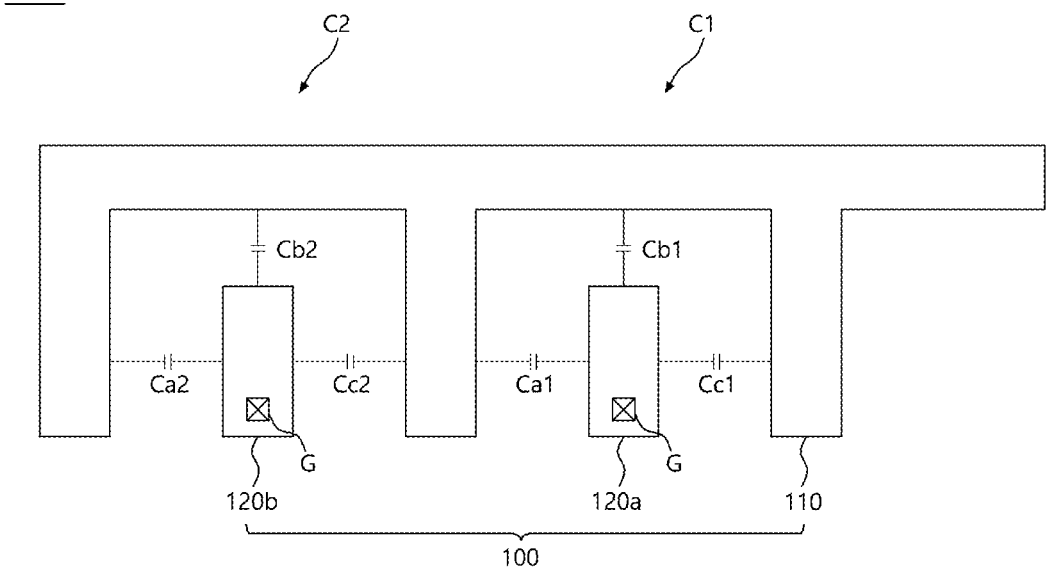
FIG. 2 is a plan view illustrating an example of a first level capacitor according to an embodiment of the inventive concept.

The first level capacitor 100 may be formed over the first interlayer insulating layer 105 formed on a semiconductor substrate 101. Various circuit elements may be interposed between the semiconductor substrate 101 and the first interlayer insulating layer 105. As illustrated in FIG. 2, the first level capacitor 100 may include a first capacitor electrode 110 and second capacitor electrodes 120a and 120b. The first capacitor electrode 110 may have, for example, a comb shape. The second capacitor electrodes 120a and 120b may have a bar shape inserted between teeth of the comb-shaped first capacitor electrode 110. The first and second capacitor electrodes 110 and 120a and 120b constituting the first level capacitor 100 may be formed of, for example, a first metal layer. A first capacitance C1 of the first level capacitor 100 may be obtained from a sum of capacitances Ca1, Cb1, and Cc1 formed between the first capacitor electrode 110 and the second capacitor electrode 120a. A second capacitance C2 of the first level capacitor 100 may be obtained from a sum of capacitances Ca2, Cb2, and Cc2 formed between the first capacitor electrode 110 and the second capacitor electrode 120b. A capacitance of the first level capacitor 100 may be obtained from a sum of the first capacitance C1 and the second capacitance C2.

The first capacitor electrode 110 of the first level capacitor 100 may be floating, and the second capacitor electrodes 120a and 120b may be selectively coupled to a power supply voltage terminal VDD or a ground voltage terminal VSS according to a set data code.

The second interlayer insulating layer 115 may be formed over the first interlayer insulating layer 105 in which the first level capacitor 100 is formed.

Figure 3:
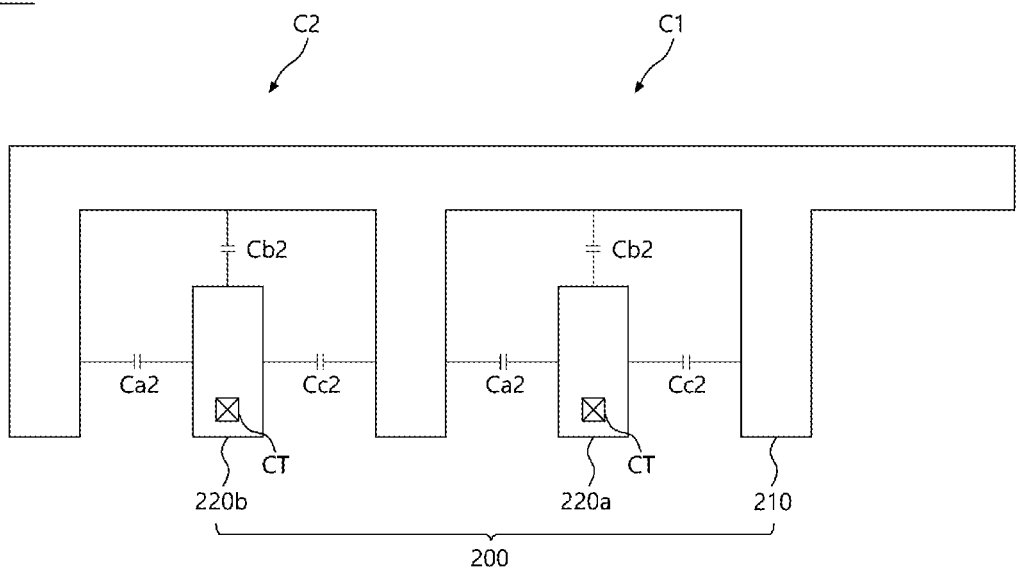
FIG. 3 is a plan view illustrating an example of a second level capacitor according to an embodiment of the inventive concept.

The second level capacitor 200 may be formed over the second interlayer insulating layer 115, and may overlap the first level capacitor 100. As illustrated in FIG. 3, the second level capacitor 200 may have substantially the same structure as the first level capacitor 100. The second level capacitor 200 may include a first capacitor electrode 210 and second capacitor electrodes 220a and 220b. The first capacitor electrode 210 of the second level capacitor 200 may be floating, and the second capacitor electrodes 220a and 220b may be selectively coupled to the power supply voltage terminal VDD or the ground voltage terminal VSS. The second capacitor electrode 120a of the first level capacitor 100 and the second capacitor electrode 220a of the second level capacitor 200 may be electrically coupled to each other through a contact unit CT. The second capacitor electrode 120b of the first level capacitor 100 and the second capacitor electrode 220b of the second level capacitor 200 may also be electrically coupled to each other through a contact unit CT.

The third interlayer insulating layer 125 may be formed over the second interlayer insulating layer 115 in which the second level capacitor 200 is formed.

The third level capacitor 300 may be formed over the third interlayer insulating layer 125. The third level capacitor 300 may have substantially the same structure as the first level capacitor 100 and the second level capacitor 200. The third level capacitor 300 may overlap the first level capacitor 100 and the second level capacitor 200 when viewed from above. The third level capacitor 300 may include a first capacitor electrode 310a and second capacitor electrodes 320a and 320b insulated from each other to constitute a capacitor like the first and second level capacitors 100 and 200. The first capacitor electrode 310a of the third level capacitor 300 may be selectively coupled to an output voltage terminal VCM_out through a switch SW. The second capacitor electrode 320b of the third level capacitor 300 may be coupled to the second capacitor electrode 220b of the second level capacitor 200 through contact units CT. Likewise, the first capacitor electrode 320a of the third level capacitor 300 may be coupled to the first capacitor electrode 220a of the second level capacitor 200 through contact units CT.

Hereinafter, an operation of an analog capacitor according to an embodiment of the inventive concept will be described.

First, a comparative example that only the first level capacitor 100 is formed on the semiconductor substrate and the first capacitor electrode 110 is coupled to the output voltage terminal VCM_out will be described with reference to FIG. 4.

Figure 4:
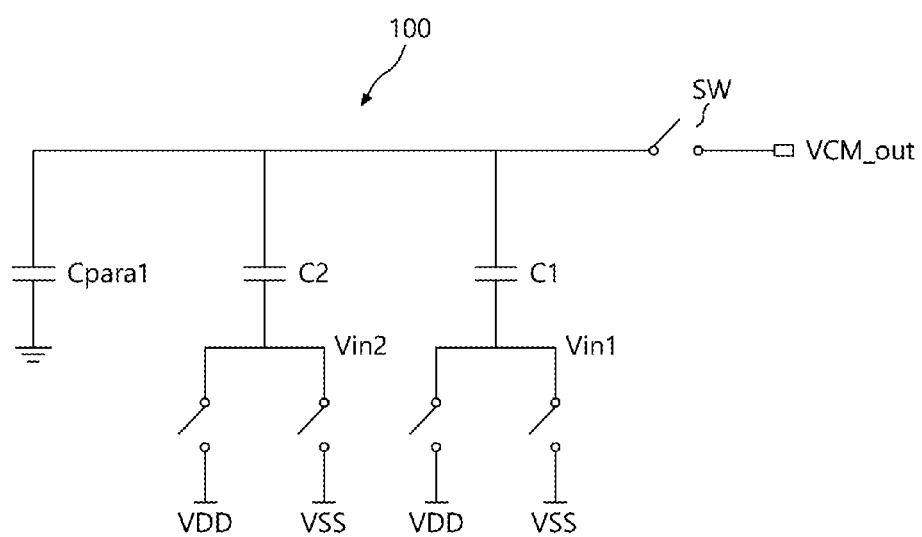
FIG. 4 is a diagram illustrating charge and discharge operations of a first level capacitor according to an embodiment of the inventive concept.

Referring to FIG. 4, the ground voltage VSS may be selected as a first input voltage Vin1 and a second input voltage Vin2, respectively. Thus, the ground voltage VSS may be applied to the second capacitor electrodes 120a and 120b of the first level capacitor 100, respectively. Accordingly, a voltage across the first level capacitor 100 may be obtained from the total capacitance of the first capacitance C1 and the second capacitance C2.

The voltage across the capacitors when charging or discharging the capacitors may be controlled by selectively providing the power supply voltage VDD and the ground voltage VSS as the first input voltage Vin1 and the second input voltage Vin2 according to a preset digital code. For example, when the power supply voltage VDD is selected as the first and the second input voltages Vin1 and Vin2, the output voltage may be VDD+Vcm.

However, a first parasitic capacitor Cpara1 having considerable capacitance may be formed between the semiconductor substrate 101, which is provided with the ground voltage VSS, and the first level capacitor 100. Thus, the output voltage may be varied. For example, even though the theoretical output voltage of the first level capacitor 100 is Vout, 0.9 Vout may be sensed as the output voltage. In this example, it may be estimated that the first parasitic capacitor Cpara1 formed between the semiconductor substrate 101 and the first level capacitor 100 has caused the reduction in a voltage of the output voltage by at least 10%. That is, a sum of effective capacitances of the first level capacitor 101 and the first parasitic capacitor Cpara1 may correspond to the reduced output voltage.

However, in an embodiment, because the second and third level capacitors 200 and 300 are stacked one on another over the first level capacitor 100, and because the final output voltage terminal VCM_out is coupled to the first capacitor electrode 310 of the third level capacitor 300, which is the uppermost capacitor, the effect of the parasitic capacitor may be considerably reduced.

Figure 5:
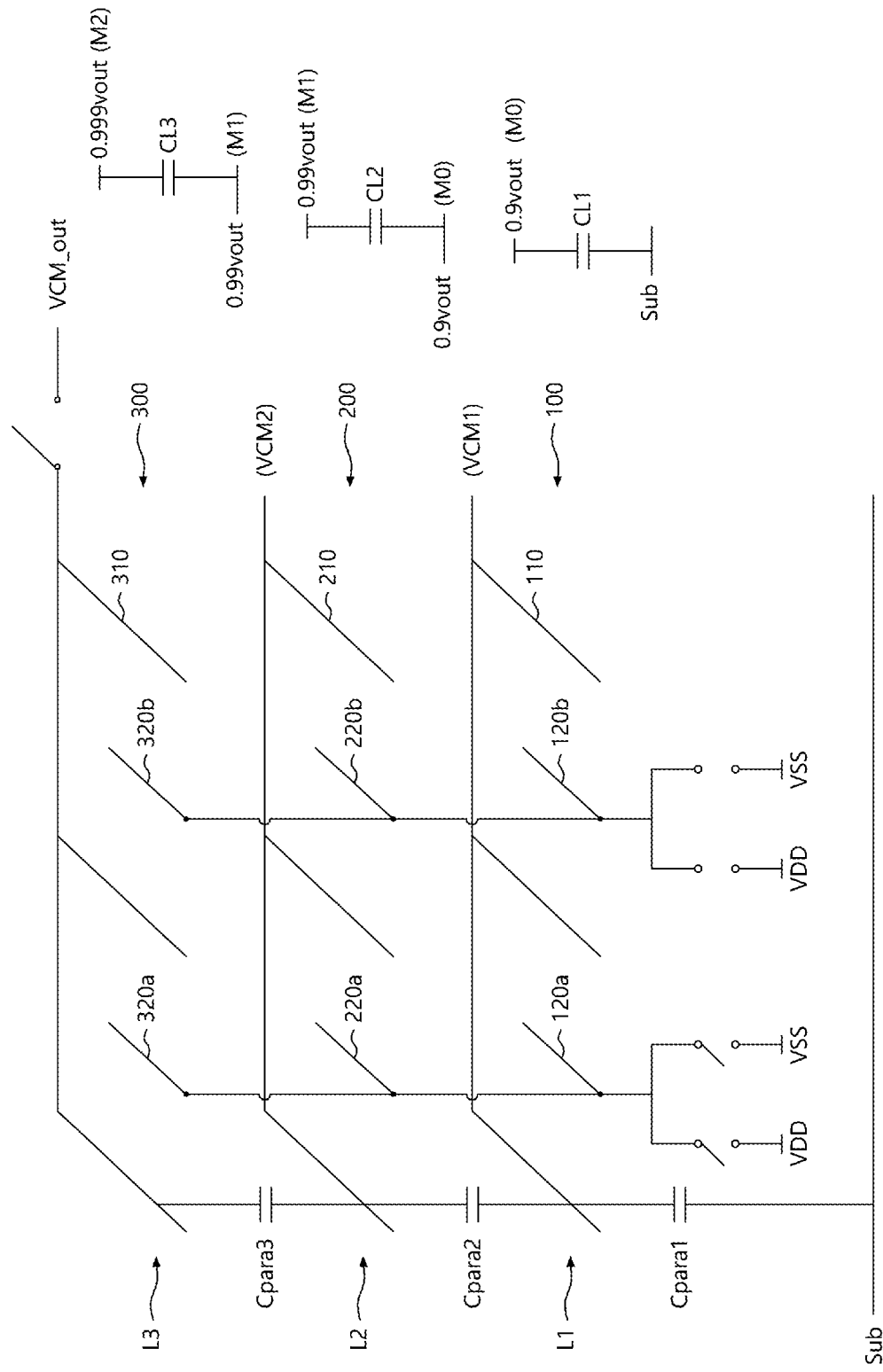
FIG. 5 is a diagram illustrating an example operation of an analog capacitor according to an embodiment of the inventive concept.

Referring to FIG. 5, when the second and third level capacitors 200 and 300 are stacked over the first level capacitor 100, a first parasitic capacitor Cpara1 may be formed between the semiconductor substrate 101 ('Sub' in FIG. 5) and the first level capacitor 100, a second parasitic capacitor Cpara1 may be formed between the first level capacitor 100 and the second level capacitor 200, and a third parasitic capacitor Cpara3 may be formed between the second level capacitor 200 and the third level capacitor 300.

As described above, when it is assumed that the output voltage Vout of the first level capacitor 100 is reduced by 10% (e.g., a voltage of 0.9 Vout is output), a first effective capacitance CL1 obtained by considering mutual capacitance compensation of the first parasitic capacitor Cpara1 and the first level capacitor 100 may correspond to a reduction of 10% in the voltage of the output voltage Vout.

The relationship between the first level capacitor 100 and the second level capacitor 200 will be described below. An output voltage of the first level capacitor 100 may be provided as an input voltage of the second level capacitor 200. For example, when the theoretical output voltage of the second level capacitor 200 is set to Vout, a difference (Vout-0.9 Vout) between the input voltage and the theoretical output voltage of the second level capacitor 200 may be 0.1 Vout. Accordingly, a second effective capacitance CL2 obtained by considering mutual capacitance compensation between the second parasitic capacitor Cpara2 and the second level capacitor 200 may correspond to a reduction of 1% in the voltage of the output voltage Vout. Therefore, an actual output voltage of the second level capacitor 200 may be 0.99 Vout.

The relationship between the second level capacitor 200 and the third level capacitor 300 will be described below. An output voltage of the second level capacitor 200 may be provided as an input voltage of the third level capacitor 300. For example, when the theoretical output voltage of the third level capacitor 300 is also set to Vout, since a difference (Vout-0.99 Vout) between the input voltage and the theoretical output voltage of the third level capacitor 300 may be 0.01 Vout, a third effective capacitance CL3 obtained by considering mutual capacitance compensation between the third parasitic capacitor Cpara3 and the third level capacitor 300 may correspond to a reduction of 0.1% in the output voltage. Therefore, an actual output voltage of the third level capacitor 300 may be 0.999 Vout.

Accordingly, the final output voltage of the third level capacitor 300 may be a value close to the theoretical output voltage Vout.

In an embodiment, the third level capacitor 300 which is formed at the uppermost position of the analog capacitor and coupled to the output voltage terminal may refer to a main analog capacitor, and the first and second level capacitors 100 and 200 interposed between the semiconductor substrate 101 and the main analog capacitor 300 may refer to a sub analog capacitor.

In an embodiment, since the analog capacitor are formed by stacking multi-level metal capacitors, the parasitic capacitance of the noise type parasitic capacitor Cpara1 formed between the semiconductor substrate 101 and an initial metal capacitor (e.g., the first level capacitor 100) may be substantially compensated through the second and third level capacitors 200 and 300, and the output voltage may be accurately retained.

The first to third level capacitors 100, 200, and 300 may overlap each other when viewed from above, and thus additional spaces are not needed.

Since the first to third level capacitors 100, 200, and 300 may be simultaneously formed with processes for first to third metals M0 to M2 used in the semiconductor fabrication process, a separate process for forming the first to third level capacitors 100, 200, and 300 and the dielectric may not be necessary.

The analog capacitor in an embodiment may be formed, for example, by using three-layered metal capacitors, but the present disclosure is not limited thereto, and a more accurate output voltage may be obtained by stacking four or more metal capacitor layers. When a plurality of metal capacitors are stacked, only the first capacitor electrode of the uppermost metal capacitor may be coupled to the output voltage terminal, and the first capacitor electrodes of the metal capacitors below the uppermost metal capacitor may be floating.

The first capacitor electrode constituting each level metal capacitor may be formed in the comb shape, and the second capacitor electrodes may be formed to be inserted between the teeth of the comb-shaped first capacitor electrode, but the present disclosure is not limited thereto.

Figure 6:
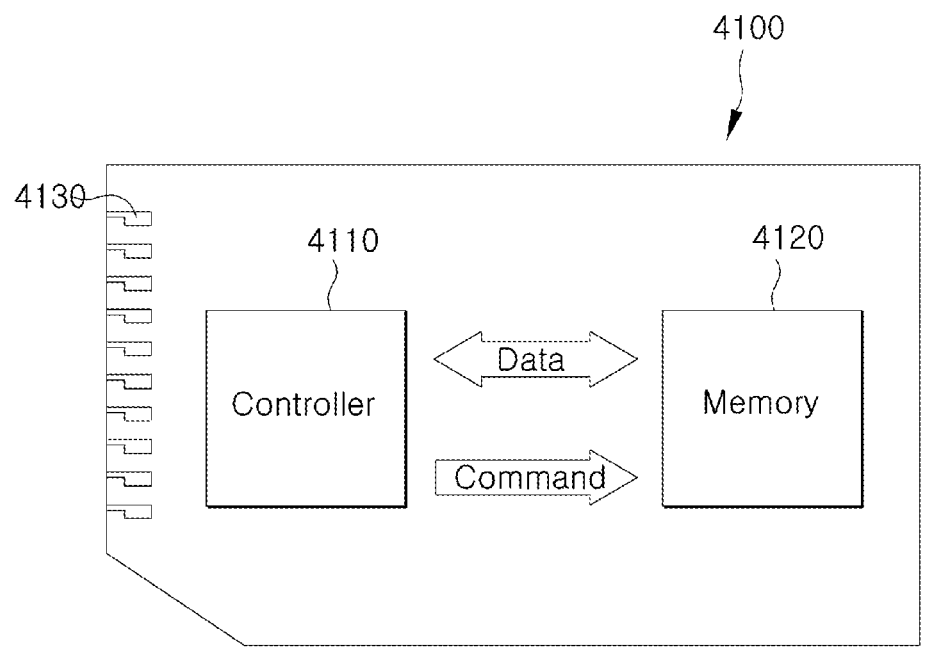
FIG. 6 is a diagram illustrating an example of a memory card having a semiconductor device according to various embodiments of the inventive concept.

FIG. 6 is a diagram illustrating an example of a memory card having a semiconductor device according to various embodiments of the inventive concept.

Referring to FIG. 6, a memory card system 4100 may include a controller 4110, a memory 4120, and an interface member 4130. The controller 4110 and the memory 4120 may exchange command signals and/or data signals with each other. For example, the memory 4120 may be used to store a command to be executed by the controller 4110 and/or user data.

The memory card system 4100 may store data in the memory 4120 or output data from the memory 4120 to an external device. The memory 4120 may include a semiconductor device according to any one of the above-described embodiments.

The interface member 4130 may function to input and output data from and to an external device. The memory card system 4100 may be a multimedia card (MMC), a secure digital card (SD) or a portable data storage device.

Figure 7:
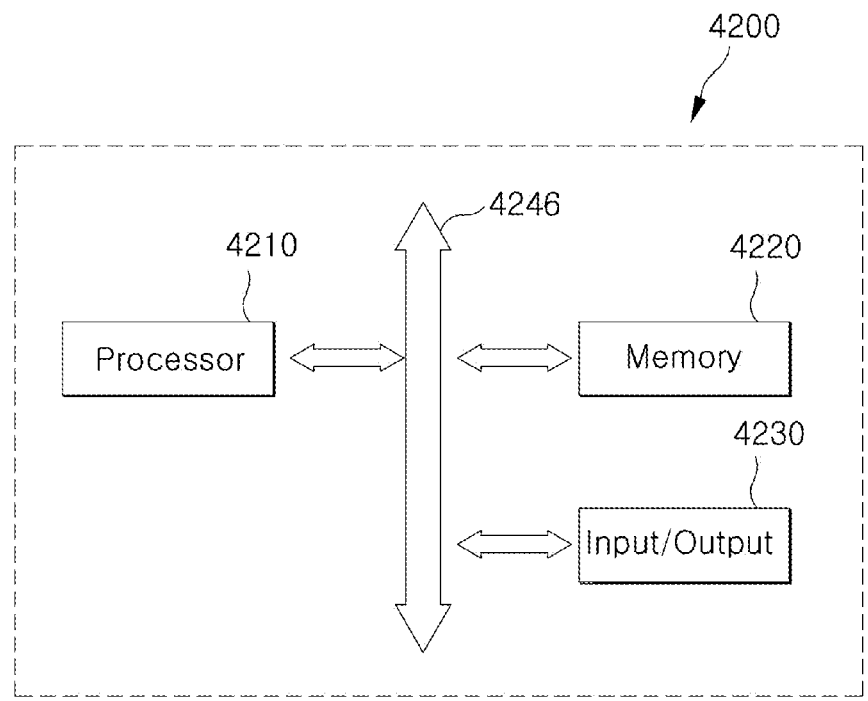
FIG. 7 is a diagram illustrating an example of an electronic apparatus including a semiconductor device according to various embodiments of the inventive concept.

FIG. 7 is a diagram illustrating an example of an electronic apparatus including a semiconductor device according to various embodiments of the inventive concept.

Referring to FIG. 7, an electronic apparatus 4200 may include a processor 4210, a memory 4220, and an input/output (I/O) device 4230. The processor 4210, the memory 4220, and the I/O device 4230 may be electrically coupled to each other through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include a semiconductor device according to any one of the above-described embodiments. The above-described embodiments can be implemented in any of numerous ways. The circuits and control signals discussed above may be modified, and additional circuits and control signals may be provided. Accordingly, such modifications and additions are deemed to be within the scope of the invention.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

The electronic apparatus 4200 discussed above may be realized as follows.

Figure 8:
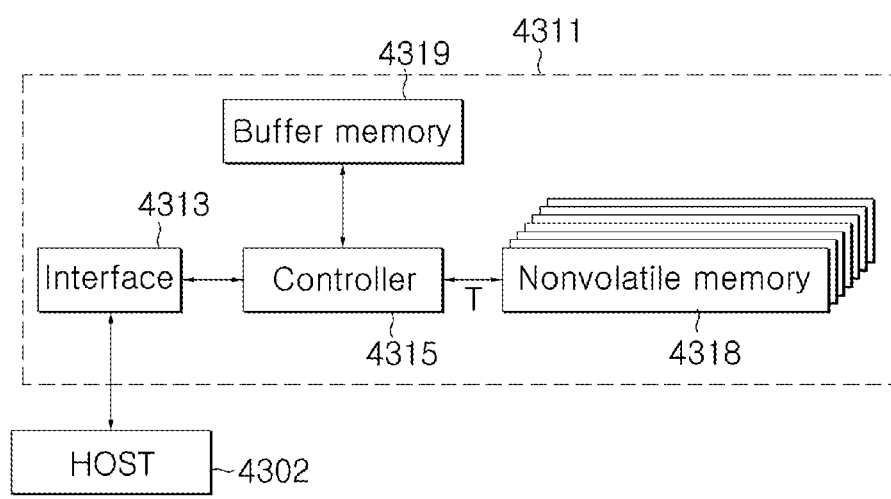
FIG. 8 is a diagram illustrating an example of a data storage apparatus including a semiconductor device according to various embodiments of the inventive concept.

FIG. 8 is a diagram illustrating an example of a data storage apparatus including a semiconductor device according to various embodiments of the inventive concept.

Referring to FIG. 8, a data storage apparatus 4311 such as a solid state disk (SSD) may be provided. The SSD 4311 may include an interface 4313, a controller 4315, a nonvolatile memory 4318, and a buffer memory 4319.

The SSD 4311 may store information using a semiconductor device. The SSD 4311 has faster read and write rates than traditional hard disk drives (HDD). The SSD 4311 has a lower mechanical delay or failure rate than the HDD, and may generate less heat and noise than the HDD. Further, the SSD 4311 may be smaller and lighter than the HDD. The SSD 4311 is widely used in a notebook PC, a net book, a desktop PC, an MP3 player, or a portable storage device.

The controller 4315 may be electrically coupled to the interface 4313. The controller 4315 may be a microprocessor including a memory controller and a buffer controller. The nonvolatile memory 4318 may be electrically coupled to the controller 4315 via a connection terminal T. The data storage capacity of the SSD 4311 may correspond to the nonvolatile memory 4318. The buffer memory 4319 may be electrically coupled to the controller 4315.

The interface 4313 may be electrically coupled to a host 4302, and may function to transmit and receive electrical signals such as data signals. For example, the interface 4313 may use the same standard as SATA, IDE, SCSI, and/or a combination thereof. The nonvolatile memory 4318 may be electrically coupled to the interface 4313 via the controller 4315.

The nonvolatile memory 4318 may function to store the data received through the interface 4313.

The nonvolatile memory 4318 may include a semiconductor device according to any one of the above-described embodiments. The nonvolatile memory 4318 has a characteristic that the data stored therein are retained even when power supply to the SSD 4311 is interrupted.

The buffer memory 4319 may include a volatile memory. The volatile memory may be a DRAM and/or an SRAM. The buffer memory 4319 has relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315, and then may be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 9:
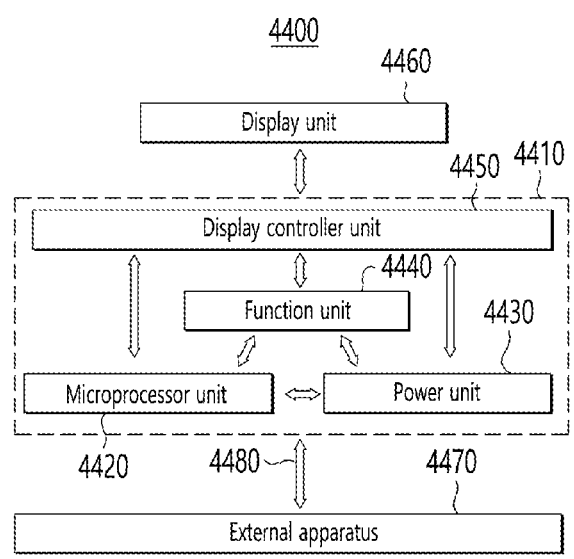
FIG. 9 is a diagram illustrating an example of an electronic apparatus including a semiconductor device according to various embodiments of the inventive concept.

FIG. 9 is a diagram illustrating an example of an electronic apparatus including a semiconductor device according to various embodiments of the inventive concept.

Referring to FIG. 9, an electronic system 4400 may include a body 4410, a microprocessor unit 4420, a power unit 4430, a function unit 4440, and a display controller unit 4450.

The body 4410 may be a mother board. For example, the body 4410 may be a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410, and may display an image processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and the like. The microprocessor unit 4420 may receive a voltage from the power unit 4430 and control the function unit 4440 and the display unit 4460. The function unit 4440 may perform various functions of the electronic system 4400. For example, when the electronic system 4400 is a portable phone, the function unit 4440 may include various components capable of performing portable phone functions, such as an image output to the display unit 4460 or a voice output to a speaker, by dialing a certain number or by communicating with an external device 4470. When a camera is mounted together, the function unit 4440 may serve as a camera image processor.

When the electronic system 4400 is electrically coupled to a memory card or the like to increase data capacity, the function unit 4440 may be a memory card controller. The function unit 4440 may exchange signals with the external device 4470 through a wired or wireless communication unit 4480. When the electronic system 4400 needs a universal serial bus (USB) or the like to expand functions thereof, the function unit 4440 may serve as an interface controller. A semiconductor device in accordance with an embodiment may be applied to at least one of the microprocessor unit 4420 and the function unit 4440.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. An analog capacitor comprising:
   a semiconductor substrate;
   a first level capacitor formed on the semiconductor substrate;

a second level capacitor formed over the first level capacitor; and
a third level capacitor formed over the second level capacitor,
wherein each of the first to third level capacitors includes a first capacitor electrode and a second capacitor electrode insulated from each other to constitute a capacitor, and
the first capacitor electrodes of the first and second level capacitors are floating, and the first capacitor electrode of the third level capacitor is selectively coupled to an output voltage terminal, and
wherein the first capacitor electrodes of the first to third level capacitors are not electrically coupled to each other.

2. The analog capacitor of claim 1, wherein the second capacitor electrodes of the first to third level capacitors are electrically coupled to each other.

3. The analog capacitor of claim 2, wherein the second capacitor electrodes of the first to third level capacitors selectively receive a power supply voltage and a ground voltage.

4. The analog capacitor of claim 3, wherein the second capacitor electrodes of the first to third level capacitors selectively receive the power supply voltage and the ground voltage according to a preset digital code.

5. The analog capacitor of claim 2, wherein the second capacitor electrodes of the first to third level capacitors are electrically coupled to each other through a contact unit.

6. The analog capacitor of claim 1, further comprising interlayer insulating layers interposed between the semiconductor substrate and the first level capacitor, between the first level capacitor and the second level capacitor, and between the second level capacitor and the third level capacitor.

7. The analog capacitor of claim 6, wherein the second and third level capacitors are formed over corresponding interlayer insulating layers among the interlayer insulating layers to overlap the first level capacitor.

8. The analog capacitor of claim 1, wherein the first level capacitor is formed of a first metal layer, the second level capacitor is formed of a second metal layer, and the third level capacitor is formed of a third metal layer.

9. The analog capacitor of claim 1, wherein the first capacitor electrode in each of the first to third level capacitors is formed in a comb shape, and the second capacitor electrode in each of the first to third level capacitors is formed in a bar shape inserted between teeth of the comb-shaped first capacitor electrode.

10. An analog capacitor comprising:
a semiconductor substrate in which a first interlayer insulating layer is formed;
a first level capacitor formed over the first interlayer insulating layer and including a first capacitor electrode and a second capacitor electrode;
a second interlayer insulating layer formed over the first interlayer insulating layer over which the first level capacitor is formed;
a second level capacitor formed over the second interlayer insulating layer and including a first capacitor electrode and a second capacitor electrode;
a third interlayer insulating layer formed over the second interlayer insulating layer over which the second level capacitor is formed;
a third level capacitor formed over the third interlayer insulating layer and including a first capacitor electrode and a second capacitor electrode; and
a contact unit configured to electrically couple the second capacitor electrodes of the first, second and third level capacitors to each other,
wherein the first capacitor electrodes of the first to third level capacitors are not electrically coupled to each other.

11. The analog capacitor of claim 10, wherein the first capacitor electrodes of the first and second level capacitors are floating, and the first capacitor electrode of the third level capacitor is selectively coupled to an output voltage terminal.

12. The analog capacitor of claim 10, wherein the second capacitor electrodes of the first to third level capacitors selectively receive a power supply voltage and a ground voltage according to a preset digital code.

13. The analog capacitor of claim 10, wherein the first to third level capacitors are formed to overlap each other.

14. The analog capacitor of claim 13, wherein the first capacitor electrode in each of the first to third level capacitors is formed in a comb shape, and the second capacitor electrode in each of the first to third level capacitors is formed in a bar shape inserted between teeth of the comb-shaped first capacitor electrodes.

15. An analog capacitor comprising:
a semiconductor substrate;
a main analog capacitor formed over the semiconductor substrate;
an interlayer insulating layer interposed between the semiconductor substrate and the main analog capacitor; and
a plurality of stacked sub analog capacitors inserted into the interlayer insulating layer,
wherein the main analog capacitor and the plurality of stacked sub analog capacitors include a first capacitor electrode and a second electrode, respectively,
the first capacitor electrodes of the main analog capacitor and the plurality of stacked sub analog capacitors are not electrically coupled to each other.

16. The analog capacitor of claim 15, wherein the first capacitor electrode is selectively coupled to an output terminal.

17. The analog capacitor of claim 16, wherein the first capacitor electrodes of each of the sub analog capacitors are formed to overlap the first capacitor electrode of the main analog capacitor and the second capacitor electrodes are formed to overlap the second capacitor electrode of the main analog capacitor.

18. The analog capacitor of claim 17, wherein the first capacitor electrodes of the sub analog capacitors are floating.

19. The analog capacitor of claim 17, wherein the second capacitor electrodes of the main analog capacitor and the sub analog capacitors are electrically coupled to each other.

20. The analog capacitor of claim 15, wherein the sub analog capacitors are insulated from each other.

* * * * *